United States Patent [19]
Ross, Jr. et al.

[11] Patent Number: 5,646,566
[45] Date of Patent: Jul. 8, 1997

[54] LOW POWER CLOCKED SET/RESET FAST DYNAMIC LATCH

[75] Inventors: Robert A. Ross, Jr., Essex Junction; Kevin A. Batson, Williston, both of Vt.

[73] Assignee: International Business Machines Corporation, Armonk, N.Y.

[21] Appl. No.: 667,682

[22] Filed: Jun. 21, 1996

[51] Int. Cl.⁶ .................................................. H03K 3/356
[52] U.S. Cl. ............................ 327/200; 327/208; 327/217
[58] Field of Search ..................................... 327/198, 199, 327/200, 202, 211, 212, 217, 203, 206, 208, 407, 408, 538, 539

[56] References Cited

U.S. PATENT DOCUMENTS

| | | | |
|---|---|---|---|
| 3,961,138 | 6/1976 | Fellinger | 178/264.5 R |
| 4,006,465 | 2/1977 | Cross et al. | 340/172.5 |
| 4,035,626 | 7/1977 | Christensen | 235/153 |
| 4,042,841 | 8/1977 | Hills et al. | 307/272 |
| 4,412,329 | 10/1983 | Yarborough, Jr. | 371/47 |
| 4,477,904 | 10/1984 | Thorsrud | 371/49 |
| 4,763,249 | 8/1988 | Bomba et al. | 364/250 |
| 4,806,786 | 2/1989 | Valentine | 307/279 |
| 5,337,149 | 8/1994 | Gaultier | 365/203 |
| 5,384,906 | 1/1995 | Horst | 395/550 |
| 5,467,037 | 11/1995 | Kumar et al. | 327/142 |
| 5,497,115 | 3/1996 | Millar et al. | 327/211 |

Primary Examiner—Timothy P. Callahan
Assistant Examiner—Sanh N. Nguyen
Attorney, Agent, or Firm—Whitham, Curtis, Whitham & McGinn; Eugene Shkurko

[57] ABSTRACT

A dynamic latch circuit design minimizes set and restore power without sacrificing speed. The dynamic latch circuit provides two significant power saving advantages over traditional dynamic latch designs. The first regulates dynamic restore power with the state of the latch. If the dynamic internal node of the latch has not been discharged, then the restore signal applied to the input of the latch is not transferred to the restore device attached to the node. By isolating the restore device under these conditions, additional power is not wasted boot-strapping up the already precharged node. Second, by design, the restore path and set path are separate. The input signals used to set the latch are different and isolated from those performing the restore. Therefore, there is no conducting path between the voltage source and circuit ground as the restore device turns on.

7 Claims, 2 Drawing Sheets

LOW POWER CLOCKED SET/RESET FAST DYNAMIC LATCH

BACKGROUND OF THE INVENTION

1. Field of the Invention

The present invention generally relates to dynamic latch-circuits and, more particularly, to a dynamic latch circuit design that utilizes power conservation techniques to minimize both set and restore power in the dynamic latch without sacrificing speed.

2. Background Description

Latch design often presents itself as one of the most significant development parameters in determining both system performance and power utilization. Latches of all kinds are abundantly used throughout designs and are absolutely essential in holding information to be processed and maintaining data integrity in the interim. For example, in microprocessor design, latches are an essential building block of fast memory storage devices called cache. One aspect of cache memory is latching (holding) control signals, such as an address line, that enter the cache. There are basically two types of latches, static latches and dynamic latches, the fastest of which being dynamic latches.

With increased system complexity and the introduction of additional parallel logic pipelines, particularly in reduced instruction set computer (RISC) architecture, the demand for latches is even greater and growing. With larger numbers and increasing utilization, the need for lower power latches is imperative.

SUMMARY OF THE INVENTION

It is therefore an object of the present invention to provide a dynamic latch circuit design which minimizes both set and restore power without sacrificing speed.

According to the invention, the dynamic latch circuit provides two significant power saving advantages over traditional dynamic latch designs. The first regulates dynamic restore power with the state of the latch. If the dynamic internal node of the latch has not been discharged, then the restore signal applied to the input of the latch is not transferred to the restore device attached to the node. By isolating the restore device under these conditions, additional power is not wasted boot-strapping up the already precharged node. The second advantage over that of traditional dynamic latch designs is its built-in control of overlap power. By design, the restore path and set path are separate. The input signals used to set the latch are different and isolated from those performing the restore. Therefore, unlike the traditional latch design, there is no conducting path between the voltage source and circuit ground as the restore device turns on.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
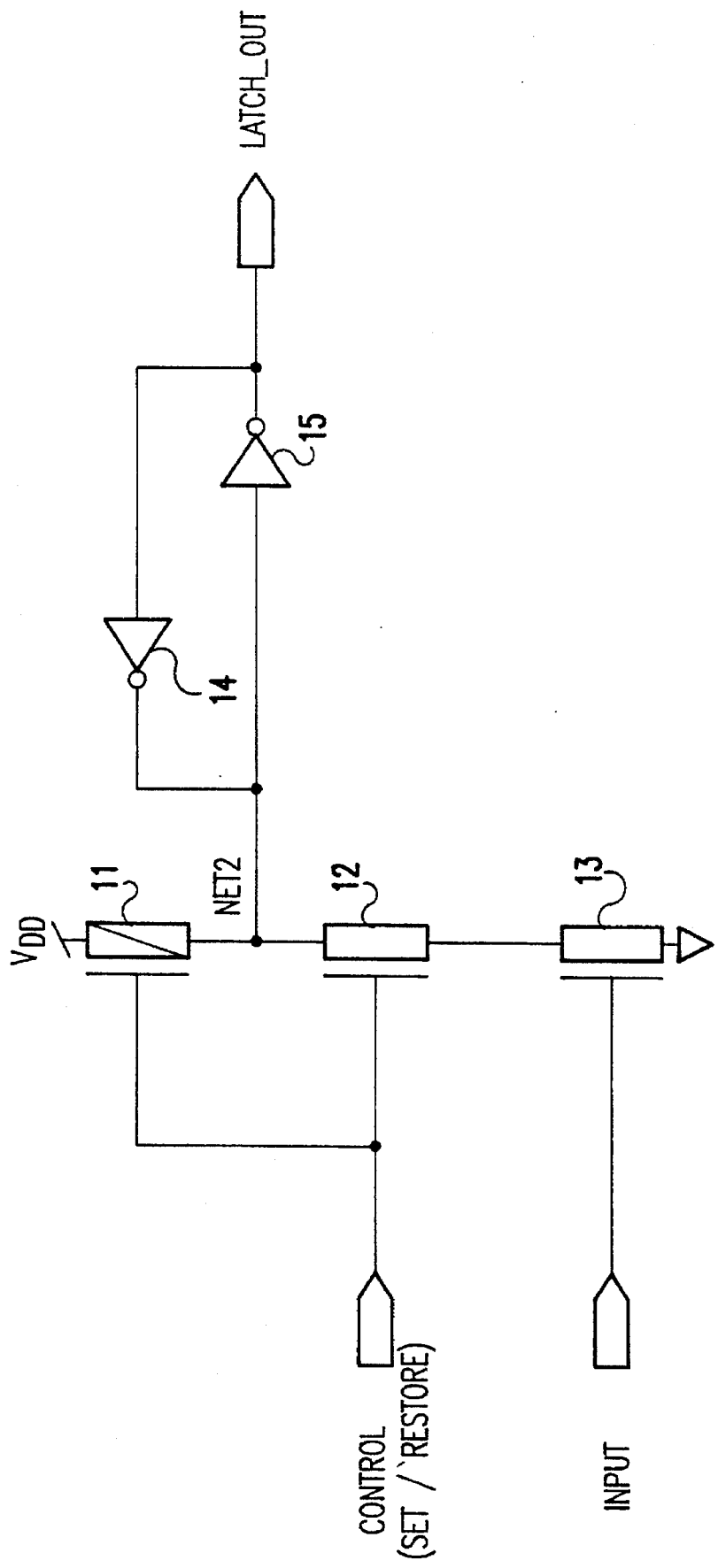
FIG. 1 is a schematic diagram showing a conventional dynamic latch circuit.

Referring now to the drawings, and more particularly to FIG. 1, there is shown by way of background an example of a conventional dynamic latch circuit which comprises a series connection of a P-type field effect transistor (PFET) 11 and two N-type FETs (NFETs) 12 and 13 connected between a voltage source $V_{DD}$ and circuit ground. The input to the latch is connected to the gate of NFET 13, while the control (set/restore) is connected to the gates of PFET 11 and NFET 12. Some conventional circuits separate the control into two lines, one for set and the other for restore; however, one line is used in the example illustrated in FIG. 1 to increase the speed of the latch. The common drain connection of PFET 11 and NFET 12 is connected to the dynamic internal node, here labeled as "NET2". The latch function is performed by cross-coupled inverters 14 and 15. These are typically composed of series connected PFET and NFET devices.

In operation, with the dynamic internal node NET2 precharged, a signal on the input line causing the NFET 13 to conduct will discharge the node NET2 when a set signal is applied to the gate of NFET 12, causing it to conduct. A restore signal of opposite polarity to the set signal will isolate the node NET2 from ground by causing the NFET 12 to stop conducting and at the same time cause PFET 11 to conduct, thereby precharging the node NET2 from $V_{DD}$.

One troubling problem of conventional dynamic latches as shown in FIG. 1 is that there is an overlap current; i.e., some devices on the set circuits are on after the set is made but before the restore is made, resulting in the restore circuits being on as well. In this short period, both set and restore devices are on when only one is needed, and this adds to the total current budget of the latch and hence increases the power consumption of the latches. It is known, for example, to use a delay circuit to avoid this problem of current overlap; however, this way of reducing current overlap causes a reduction in the speed of the latch.

Figure 2:
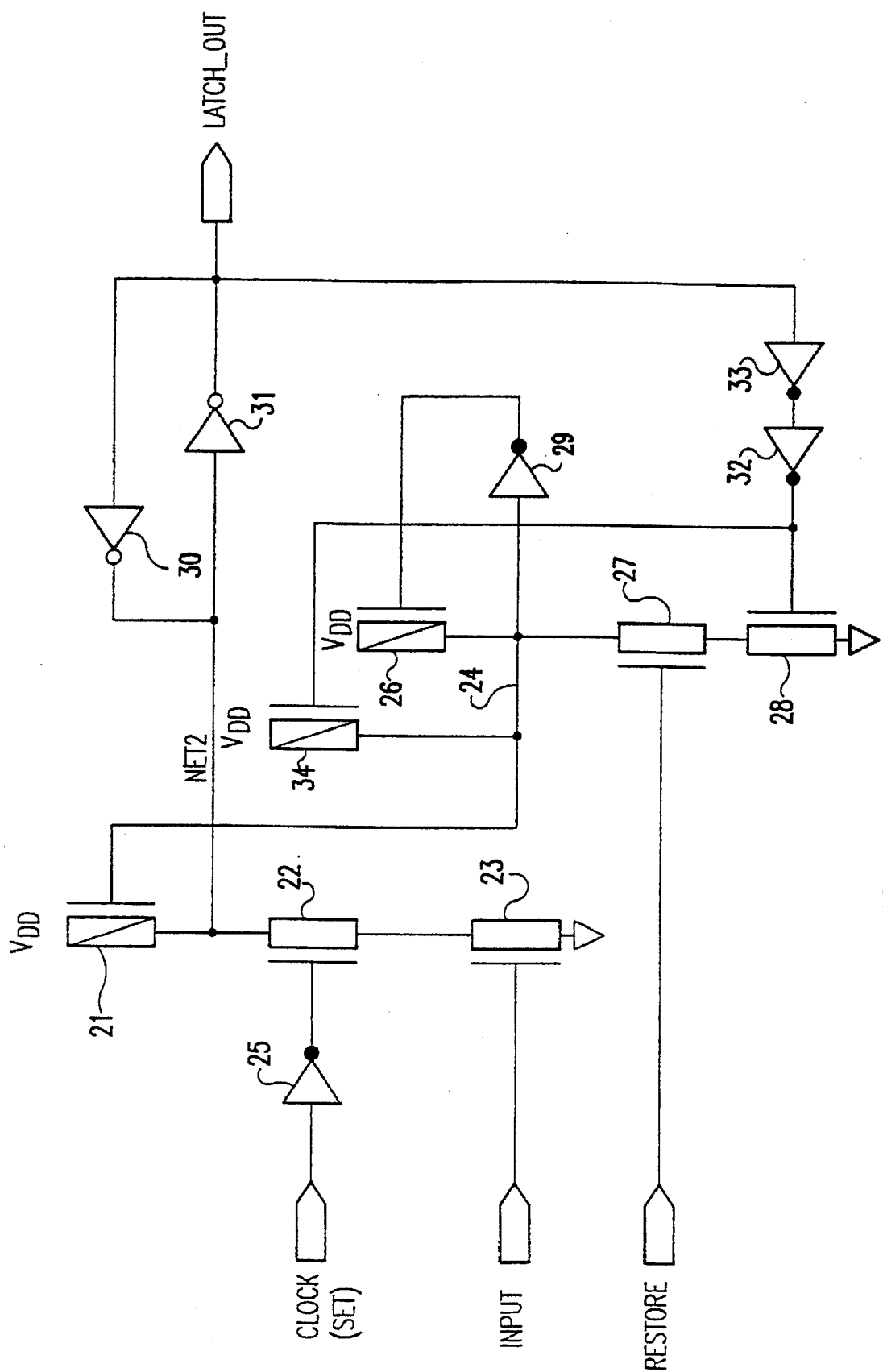
FIG. 2 is a schematic diagram showing the dynamic latch circuit according to the present invention.

The present invention separates the set and restore circuits so that they are not on at the same time. More particularly, the invention creates an interlock between the set and restore devices so that they are not on at the same time. Reference is now made to FIG. 2 of the drawings which shows the dynamic latch circuit of the invention. Similarly to the conventional latch circuit of FIG. 1, a PFET 21 and two NFETs 22 and 23 are connected in series between $V_{DD}$ and circuit ground. The input is connected to the gate of NFET 23, and the clock or set is input via inverter 25 to the gate of NFET 22.

There is now a separate restore circuit which comprises PFET 34 and NFETs 27 and 28 connected between $V_{DD}$ and circuit ground. The restore input is connected to the gate of NFET 27, and the common drain connection of PFET 26 and NFET 27, here denoted as node 24 is connected to the gate of PFET 21. Node 24 is also connected via inverter 29 to the gate of PFET 26.

The latch itself is composed of cross-coupled inverters 30 and 31, as in the conventional latch circuit. Node NET2 is connected to the input of the latch, and the output of the latch is connected via the pair of inverters 32 and 33 to the gate of NFET 28 and also to the gate of PFET 34 which is connected between $V_{DD}$ and node 28.

In operation, if the dynamic internal node NET2 has not been discharged, then the restore signal applied to the gate of NFET 27 is not transferred to the PFET 21, which functions as a pull-up restore device. Thus, by isolating the restore device under these conditions, additional power is not wasted boot-strapping up (above $V_{DD}$) the already precharged node NET2. Also, the restore path and set (forward functional) path are separate so that the input signals used to set the latch are different and isolated from those performing the restore. In this way, there is no conducting path between $V_{DD}$ and circuit ground as the PFET 21 turns on and the NFET 22 turns off in the restore mode and vice versa in the set mode.

The dynamic latch circuit according to the invention is both fast and low power in operation. The output is restored only if it has been discharged. If the output has already been charged, then a restore to a charged state takes no power and no time and is actually faster because a restore is not needed.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A dynamic latch circuit comprising:

an input line, a set line, a restore line and an output line;

a dynamic internal node connected to an input of a latch, an output of said latch being connected to said output line;

an input and set path connected to said dynamic internal node;

a restore device connected to said dynamic internal node for precharging said dynamic internal node; and a restore circuit connected to said restore line and controlled by the output of said latch for controlling said restore device to precharge said dynamic internal node in response to a restore signal on said restore line only when said dynamic internal node has been discharged.

2. The dynamic latch circuit recited in claim 1, wherein said restore circuit is interlocked with said input and set path so that when signals occur on said set and restore lines at overlapping times, no current flows from said restore device for charging said dynamic node.

3. The dynamic latch circuit recited in claim 2 wherein the output of said latch is connected to said restore circuit to provide the interlock with said set path.

4. The dynamic latch circuit recited in claim 3 wherein said restore device is a first field effect transistor (FET) of a first conductivity type and said input and set path comprises second and third FETs of a second conductivity type, said first, second and third FETs being connected in series between a source of voltage and circuit ground, said set line and said input line being respectively connected to gates of said second and third FETs.

5. The dynamic latch circuit recited in claim 4 wherein said restore circuit comprises a fourth FET of said first conductivity type and fifth and sixth FETs of said second conductivity type connected in series between said source of voltage and circuit ground, a common node between said fourth and fifth FETs being connected to a gate of said first FET, said restore line being connected to a gate of said fifth FET, and the output of said latch being connected to gates of said fourth and sixth FETs.

6. The dynamic latch circuit recited in claim 5 wherein said restore circuit further comprises a seventh FET of said first conductivity type connected between said voltage source and said common node and an inverter connected between said common node and a gate of said seventh FET.

7. A dynamic latch circuit comprising:

a dynamic internal node connected to an input of a latch, an output of said latch being connected to an output line;

an input and set path connected to said dynamic internal node;

a restore path connected to said dynamic internal node for precharging said dynamic internal node; and a circuit controlled by the output of said latch for controlling said restore path independent of said set path to precharge said dynamic internal node in response to a restore signal only when said dynamic internal node has discharged, said circuit being interlocked with said set path so that when signals occur on said set and restore lines at overlapping times, no current flows for charging said dynamic node.

* * * * *